United States Patent
Kim et al.

(10) Patent No.: US 7,352,618 B2
(45) Date of Patent: Apr. 1, 2008

(54) MULTI-LEVEL CELL MEMORY DEVICE AND ASSOCIATED READ METHOD

(75) Inventors: Dae-Han Kim, Seoul (KR); Seung-Keun Lee, Yongin-sin (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/296,476

(22) Filed: Dec. 8, 2005

(65) Prior Publication Data

US 2006/0126387 A1 Jun. 15, 2006

(30) Foreign Application Priority Data

Dec. 15, 2004 (KR) .............. 10-2004-0106388
Dec. 15, 2004 (KR) .............. 10-2004-0106390

(51) Int. Cl.
*G11C 11/34* (2006.01)

(52) U.S. Cl. .............. 365/185.02; 365/185.03; 365/185.05; 365/185.17; 365/185.21; 365/185.25

(58) Field of Classification Search .......... 365/185.02, 365/185.03, 185.05, 185.17, 185.21, 185.25
See application file for complete search history.

(56) References Cited

U.S. PATENT DOCUMENTS

| | | | | |
|---|---|---|---|---|
| 5,414,658 A | * | 5/1995 | Challa | 365/185.06 |
| 5,539,690 A | * | 7/1996 | Talreja et al. | 365/185.22 |
| 5,675,537 A | * | 10/1997 | Bill et al. | 365/185.22 |
| 5,745,475 A | * | 4/1998 | Ohno et al. | 369/275.4 |
| 5,862,074 A | * | 1/1999 | Park | 365/185.03 |
| 6,002,614 A | * | 12/1999 | Banks | 365/189.01 |
| 6,292,399 B1 | * | 9/2001 | Le et al. | 365/185.21 |
| 6,373,748 B2 | * | 4/2002 | Ikehashi et al. | 365/185.22 |
| 6,438,038 B2 | * | 8/2002 | Ikehashi et al. | 365/185.24 |
| 6,490,203 B1 | * | 12/2002 | Tang | 365/185.22 |
| 6,512,689 B1 | * | 1/2003 | Naji et al. | 365/158 |
| 6,674,668 B2 | * | 1/2004 | Ikehashi et al. | 365/185.24 |
| 6,768,680 B2 | * | 7/2004 | Kato | 365/185.22 |
| 6,845,047 B2 | * | 1/2005 | Ikehashi et al. | 365/189.01 |
| 6,873,551 B2 | * | 3/2005 | Bedarida et al. | 365/185.21 |
| 6,999,345 B1 | * | 2/2006 | Park et al. | 365/185.18 |
| 7,002,843 B2 | * | 2/2006 | Guterman et al. | 365/185.03 |
| 7,016,232 B2 | * | 3/2006 | Lee et al. | 365/185.21 |

FOREIGN PATENT DOCUMENTS

| | | |
|---|---|---|
| JP | 10-050079 | 2/1998 |
| JP | 2000-268593 | 9/2000 |
| KR | 1020000033906 | 6/2000 |
| KR | 1020010002603 | 1/2001 |
| KR | 1020030001608 | 1/2003 |

* cited by examiner

*Primary Examiner*—Viet Q. Nguyen
(74) *Attorney, Agent, or Firm*—Volentine & Whitt, PLLC

(57) ABSTRACT

A NOR flash memory device comprises a memory cell adapted to store at least two bits of data. A read operation is performed on the memory cell by generating a reference current with a first magnitude to detect the value of a most significant bit (MSB) and generating the reference current with a second magnitude to detect the value of a least significant bit (LSB). The respective values of the MSB and the LSB are detected by comparing the first and second reference currents to an amount of current flowing through the memory cell during the read operation. The respective magnitudes of the first and second reference currents are determined by different reference voltages generated by a reference voltage generator.

38 Claims, 4 Drawing Sheets

MULTI-LEVEL CELL MEMORY DEVICE AND ASSOCIATED READ METHOD

BACKGROUND OF THE INVENTION

1. Field of the Invention

The present invention relates generally to a NOR flash memory device. More particularly, the invention relates to a NOR flash memory device having multi-level memory cells, and a method of sensing the logic state of the multi-level memory cells.

A claim of priority is made to Korean Patent Applications Nos. 2004-106388 and 2004-106390, both filed on Dec. 15, 2004, the disclosures of which are hereby incorporated by reference in their entirety.

2. Description of Related Art

NOR flash memory is a popular form of non-volatile data storage used in various portable electronic devices such as cell phones, personal digital assistants (PDAs), removable memory cards, and so forth. NOR flash memory is particularly well suited for applications requiring high data access speed. For example, NOR flash is often used to store program code. In contrast, NAND flash memory is often used for mass data storage due to its relatively slower data access speed and its lower price.

A flash memory cell comprises a source and a drain, both doped with N+type impurities, and a channel formed in a P-type semiconductor substrate between the source and the drain. The flash memory cell further comprises a floating gate formed over the channel, and a control gate formed over the floating gate. The floating gate is separated from the channel by a thin oxide insulating layer, and the control gate is separated from the floating gate by a thin oxide insulating layer.

A flash memory cell is programmed by placing a high voltage (e.g., 12V) on the control gate while generating a current across the channel region, e.g., by placing 6V on the drain region and connecting the source region to ground. The combination of the high voltage and the current causes some electrons in the current to be transferred to the floating gate via "hot-electron injection."

A flash memory cell is read by placing a voltage of about 4.5 or 5V on the control gate, a voltage of about 1V on the drain, and a voltage of about 0V on the source. Under these conditions, current may or may not flow across the channel depending on how many electrons are stored in the floating gate. Accordingly, the logic state of the memory cell can be detected by determining how much current flows across the channel.

Where the memory cell is programmed, the electrons transferred to the floating gate partially cancel out an electrical field generated by the voltage on the control gate, and therefore relatively little current flows through the channel. In other words, the electrons on the floating gate effectively elevate the threshold voltage of the memory cell so that it does not turn on. On the other hand, where the memory cell has not been programmed, current readily flows through the channel because the 4.5 or 5V on the control gate is above the threshold voltage of the memory cell when it is not programmed.

Like most memory devices, NOR flash memory preferably stores a large amount of data in a small area. One way to increase the amount of data stored in an area of a NOR flash memory device is to increase the number of memory cells in the area. Yet another way to increase the amount of data stored in an area of a NOR flash memory device is to increase the number of bits stored in each memory cell.

A memory cell storing more than one bit of data is referred to as a "multi-level cell," and a device containing multi-level cells is called a "multi-level cell device." For instance, a memory cell storing 2 bits has four "levels" or logic states: "11", "10", "01", and "00". The four states of a 2-bit flash memory cell can be distinguished by measuring the amount of current that flows through the channel during a read operation rather than simply detecting presence or absence of current. The flash memory cell can be programmed to one of the four states by placing different amounts of electrons on the floating gate.

In a conventional multi-level cell device, the logic state of each multi-level cell is measured by a set of sense amplifiers adapted to detect and amplify differences between various reference currents and a channel current flowing through the channel of the multi-level flash cell. For instance, the 2-bit flash memory cell is generally read by generating three (3) reference currents and comparing each of the reference currents to the channel current using three respective sense amplifiers. The relationship between the channel current and the three reference currents is then used to determine the logic state of the multi-level flash cell. For instance, if the channel current is larger than all three of the reference currents, then the multi-level flash cell has the logic state "11". If the channel current is larger than two of the reference currents, then the multi-level flash cell has the logic state "10", and so forth.

Unfortunately, it is extremely difficult to form each of the sense amplifiers to have the same characteristics. Due to mismatches in the sense amplifier characteristics, it is difficult to sense small differences in the current flowing through the channel of the NOR flash memory device.

SUMMARY OF THE INVENTION

According to an embodiment of the present invention, a NOR flash memory device comprises a memory cell adapted to store two or more bits of data, a reference voltage generator adapted to generate a plurality of different reference voltages, a sense amplifier adapted to sequentially detect the values of the two or more bits of data according to a reference current whose magnitude is determined by the different reference voltages, and a selection circuit adapted to select which of the different reference voltages determine the magnitude of the reference current.

According to another embodiment of the invention, a NOR flash memory device comprises a memory cell adapted to store two or more bits of data, a reference voltage generator adapted to generate a plurality of different reference voltages, a sense amplifier adapted to sequentially detect the values of the two or more bits of data according to a reference current whose magnitude is determined by the different reference voltages, a latch circuit adapted to store the values detected by the sense amplifier, and a selection circuit adapted to select which of the different reference voltages determine the magnitude of the reference current.

According to still another embodiment of the present invention, a NOR flash memory device comprises a memory cell adapted to store two or more bits of data, a reference voltage generator adapted to generate a plurality of different reference voltages, a sense amplifier adapted to sequentially detect the values of the two or more bits of data according to a reference current whose magnitude is determined by the different reference voltages, a latch circuit adapted to store the values detected by the sense amplifier, a selection circuit adapted to select which of the different reference voltages determine the magnitude of the reference current, and a switch circuit adapted to provide one of the different reference voltages to the sense amplifier in response to a plurality of selection signals generated by the selection circuit.

According to yet another embodiment of the present invention, a method of sequentially detecting the values of two or more bits of data stored in a memory cell of a NOR flash memory device comprises detecting the value of a most significant bit of data stored in the memory cell according to a voltage level apparent at a sensing node. Then, upon detecting the value of the most significant bit, the method further comprises precharging the sensing node to a predetermined voltage level and sensing the value of a least significant bit stored in the memory cell according to the value of the most significant bit.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

The exemplary embodiments relate generally to a NOR flash memory device containing multi-level cells. In theory, each of the multi-level cells could store an arbitrary number of bits. However, for simplicity of explanation, the multi-level cells described below are adapted to store 2 bits each.

Figure 1:
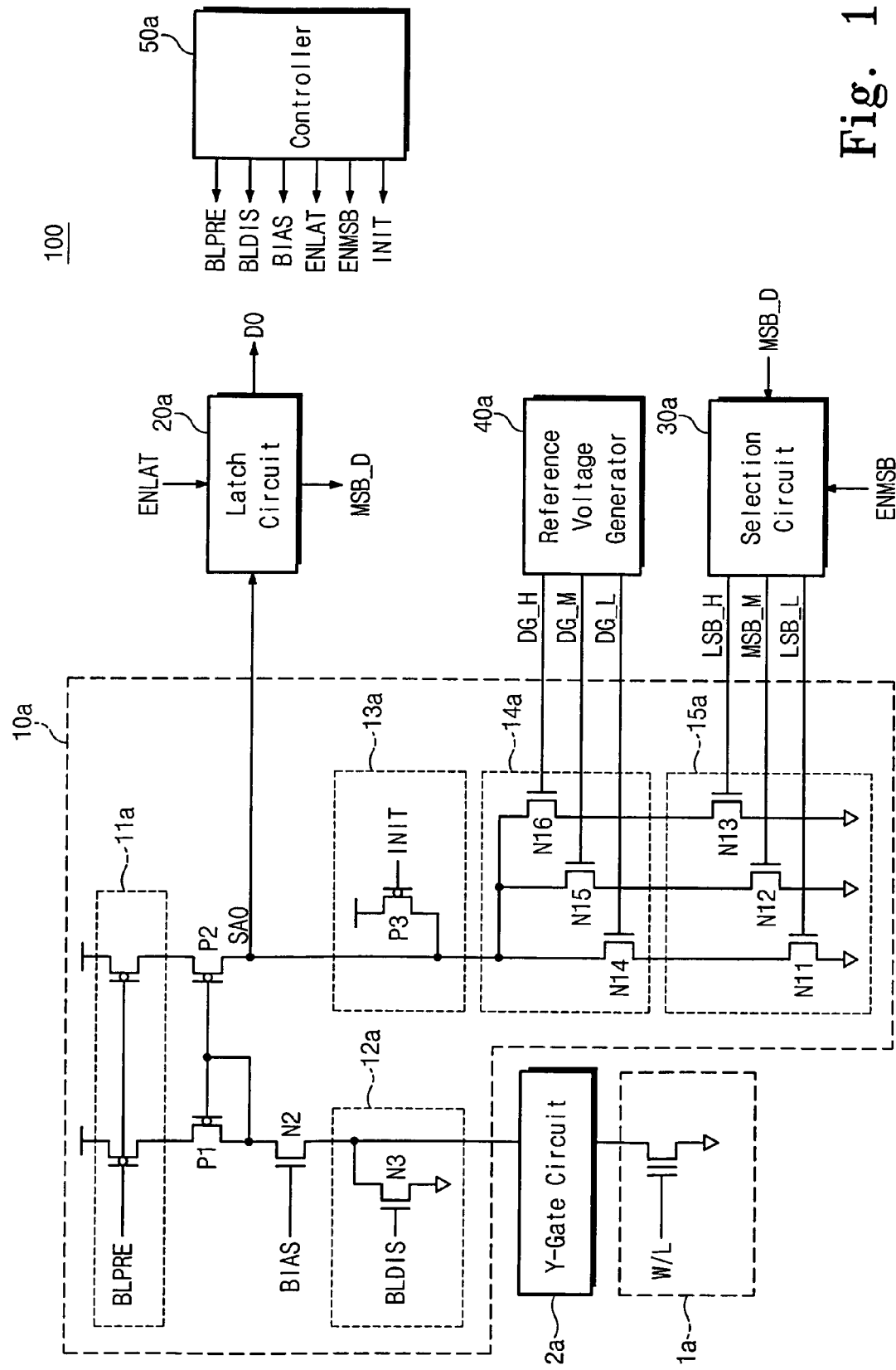
FIG. 1 is a block diagram of a NOR flash memory device according to one embodiment of the present invention.

FIG. 1 is a block diagram of a NOR flash memory device according to one embodiment of the present invention. Referring to FIG. 1, a NOR flash memory device 100 comprises a memory cell 1a, a Y-gate circuit 2a, a sense amplifier 10a, a latch circuit 20a, a selection circuit 30a, a reference voltage generator 40a, and a controller 50a.

Memory cell 1a is a multi-level cell comprising a drain, a source, a floating gate, and a control gate. During a read operation of memory cell 1a, a voltage of about 1V is applied to the drain, a voltage of about 4.5V or 5V is applied to the control gate, and a voltage of about 0V is applied to the source.

The amount of current that flows through memory cell 1a in a read operation depends on the logic state of memory cell 1a. Memory cell 1a stores two bits and therefore has four logic states: "00", "01", "10", and "11". Each of the four logic states is represented by a most significant bit (MSB) and a least significant bit (LSB). The LSB is referred to as LSB data LSB_D and the MSB is referred to as MSB data MSB_D.

Sense amplifier 10a comprises P-type metal-oxide semiconductor (PMOS) transistors P1 and P2 forming a current mirror. The amount of current flowing through memory cell 1a is the same as that flowing through PMOS transistors P1 and P2. In this written description, the term "cell current" will refer to current flowing through memory cell 1a.

Y-gate circuit 2a connects memory cell 1a to sense amplifier 10a. Y-gate circuit 2a is a conventional circuit comprising a plurality of N-type metal-oxide semiconductor (NMOS) transistors connected in series.

Sense amplifier 10a senses and amplifies a difference between the cell current and a reference current. Sense amplifier 10a comprises a precharge circuit 11a, a bitline discharge circuit 12a, a sensing node precharge circuit 13a, a reference current generating circuit 14a, a reference current selection circuit 15a, a bitline bias transistor N2, and PMOS transistors P1 and P2.

Precharge circuit 11a provides current to PMOS transistors P1 and P2 in sense amplifier 10a in response to a bitline precharge signal BLPRE. Precharge circuit 11a comprises first and second PMOS transistors respectively connected between a power supply providing a power supply voltage and PMOS transistors P1 and P2. The first and second PMOS transistors are both gated by bitline precharge signal BLPRE.

Bitline discharge circuit 12a comprises a NMOS transistor N3 connected between a bitline and ground. NMOS transistor N3 discharges the bitline in response to a bitline discharge signal BLDIS before the logic state of memory cell 1a is sensed.

Sensing node precharge circuit 13a is connected to a sensing node SA0, which serves as an output terminal of sense amplifier 10a. Sensing node precharge circuit 13a precharges sensing node SA0 to an initial voltage level in response to an initialization signal INIT. The voltage level of sensing node SA0 then changes by an amount corresponding to the magnitude of the cell current whenever the logic state of memory cell 1a is sensed.

Sensing node precharge circuit 13a provides the power supply voltage to sensing node SA0 in response to initialization signal INIT. Sensing node precharge circuit 13a comprises a metal-oxide semiconductor (MOS) transistor forming a current path between the power supply and sensing node SA0. Preferably, sensing node precharge circuit 13a comprises a PMOS transistor P3.

Reference current generating circuit 14a is connected between sensing node SA0 and reference current selecting circuit 15a. Reference current generating circuit 14a generates a reference current, which flows between sensing node SA0 and ground, based on the respective levels of different reference voltages output by reference voltage generator 40a.

For example, reference current generating circuit 14a typically comprises NMOS transistors N14, N15, and N16 connected in parallel between sensing node SA0 and reference current selecting circuit 15a. NMOS transistors N14, N15, and N16 are respectively gated by different reference voltages DG_L, DG_M, and DG_H. Reference current selecting circuit 15a connects one of NMOS transistors N14, N15, and N16 to ground so that at most one of the different reference currents flows from sensing node SA0 to ground at any given time.

Reference current selection circuit 15a comprises a plurality of selection transistors connected in parallel between reference current generating circuit 14a and ground. For example, the selection transistors typically comprise NMOS transistors N11, N12, and N13, which are connected in parallel between reference current generating circuit 14a and ground. Alternatively, the selection transistors could comprise pass transistors or PMOS transistors. NMOS transistors N11, N12, and N13 are respectively controlled by selection signals LSB_L, MSB_M and LSB_H.

During a read operation of memory cell 1a, reference current generating circuit 14a and reference current selection circuit 15a generate the reference current with a first value by activating (i.e., switching to a first logic state) selection signal MSB_M to turn on NMOS transistor N12 while maintaining NMOS transistors N11 and N13 off. As a result, the reference current flows through NMOS transistors N15 and N12. The reference current with the first value is compared to the cell current to determine the value of MSB data MSB_D. After the value of MSB data MSB_D is determined, the reference current is generated with a second value by deactivating (i.e., switching to a second logic state) selection signal MSB_M to turn off NMOS transistor N12 and activating either selection signal LSB_L or LSB_H depending on the value of MSB data MSB_D to turn on either NMOS transistor N11 or N13. The reference current with the second value is then compared to the cell current to determine the value of LSB data LSB_D.

During the read operation, bitline bias transistor N2 receives a constant direct current (DC) voltage, such as 1.5V so that the cell current can flow through PMOS transistors P1 and P2. In other words, the DC voltage turns on bitline bias transistor N2 to connect PMOS transistors P1 and P2 to memory cell 1a. If current flows through memory cell 1a, then the same current will flow through PMOS transistors P1 and P2.

Where the current flowing through PMOS transistor P2 is larger than the reference current, the voltage level of sensing node SA0 rises above the initial voltage level provided by sensing node precharge circuit 13a. Accordingly, a rise in the voltage level of sensing node SA0 can be used to detect the value of MSB data MSB_D and LSB data LSB_D.

In contrast to the conventional multi-cell device, sense amplifier 10a uses a single amplifier circuit to sense the multiple bits stored in memory cell 1a. The amplifier circuit comprises PMOS transistors P1 and P2, which form a current mirror, and NMOS transistors N11 through N16, which generate a reference current.

As described above, NOR flash memory device 100 performs two sensing operations to sense 2 bits of data. It uses a serial sensing technique involving a single sense amplifier to first detect the value of MSB data MSB_D and then detect the value of LSB data LSB_D.

In contrast, the conventional multi-level cell device uses a parallel sensing technique involving three sense amplifiers to detect the value of MSB data MSB_D and LSB data LSB_D at more or less the same time. As described above, however, the conventional multi-level cell device is error prone due to mismatches which frequently occur between the three sense amplifiers. Since NOR flash memory device 100 only uses one sense amplifier, it avoids the mismatch problem.

Latch circuit 20a receives the voltage level of sensing node SA0 through the output terminal of sense amplifier 10a. Latch circuit 20a latches the voltage level of sensing node SA0 in response to a latch enable signal ENLAT and outputs the value of MSB data MSB_D according to the voltage level of sensing node SA0. The construction and operation of latch circuit 20a is described in further detail in relation to FIG. 2.

Selection circuit 30a receives the value of MSB data MSB_D from latch circuit 20a and a MSB enable signal ENMSB. When MSB enable signal ENMSB is activated, selection circuit 30a activates selection signal MSB_M and inactivates selection signals LSB_L and LSB_H. When MSB enable signal is inactivated, selection circuit 30a activates selection signal LSB_L or LSB_H depending on the value of MSB data MSB_D and inactivates selection signal MSB_M.

At the beginning of a read operation, MSB enable signal ENMSB is typically activated so that selection signal MSB_M is activated, causing latch circuit 20a to latch and output the value of MSB data MSB_D. Selection circuit 30a then receives the value of MSB data MSB_D and deactivates MSB enable signal. Selection circuit 30a receives MSB data MSB_D and if the value of MSB data MSB_D is a logical "1", selection circuit 30a activates selection signal LSB_L. Otherwise, if the value of MSB data MSB_D is a logical "0", selection circuit 30a activates selection signal LSB_H.

Reference voltage generator 40a generates different reference voltages. In FIG. 1, the reference voltages have three different voltage levels. Reference voltage DG_M is used to generate a reference current for detecting the value of MSB data MSB_D, and reference voltages DG_L and DG_H are used to generate reference currents for detecting the value of LSB data LSB_D.

Controller 50a provides control signals ENLAT, ENMSB, and INIT to sense amplifier 10a, latch circuit 20a, and selection circuit 30a, during a read operation. Timing relationships between the control signals supplied from controller 50a are described below in relation to FIG. 3.

Figure 2:
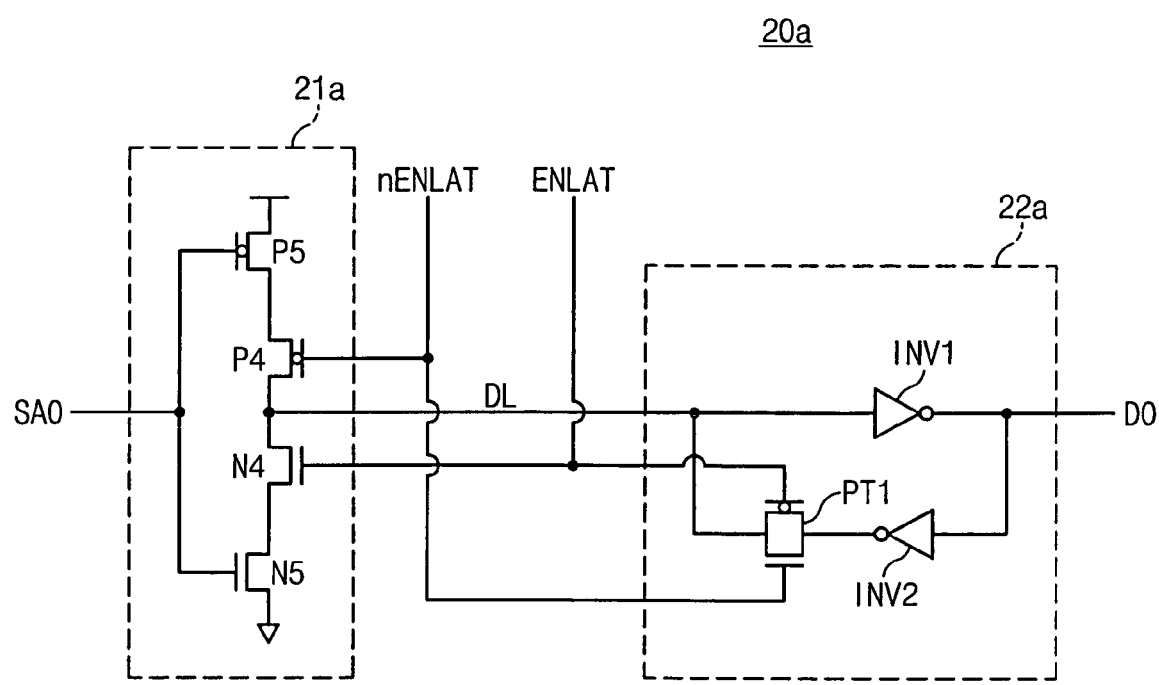
FIG. 2 is a circuit diagram of a latch circuit shown in FIG. 1.

FIG. 2 is a circuit diagram of one embodiment of latch circuit 20a shown in FIG. 1. In FIG. 2, latch circuit 20a comprises a tri-state buffer 21a and a data latch 22a.

Tri-state buffer 21a comprises an inverter connected to the output terminal of sense amplifier 10a and a data line DL. The inverter comprises a PMOS transistor P5 and a NMOS transistor N5.

Tri-state buffer 21a further comprises a PMOS transistor P4 and a NMOS transistor N4, which are turned on or off in response to latch enable signal ENLAT and inverted latch enable signal nENLAT. PMOS transistor P4 is connected between PMOS transistor P5 and data line DL and NMOS transistor N4 is connected between the data line DL and NMOS transistor N5. NMOS transistor N4 receives latch enable signal ENLAT and PMOS transistor P4 receives inverted latch enable signal nENLAT.

When the voltage level of sensing node SA0, which is apparent at the output terminal of sense amplifier 10a, is "high", and latch enable signal ENLAT is activated, NMOS transistors N5 and N4 are respectively turned on to connect data line DL to ground. Latch enable signal ENLAT is activated before a read operation is performed on memory cell 1a to discharge data line DL.

Data latch 22 comprises two inverters INV1 and INV2, and a pass transistor PT1. Inverters INV1 and INV2 latch data from data line DL and pass transistor PT1 is turned on in response to latch enable signals ENLAT and nENLAT. When inverted latch enable signal nENLAT is activated, data latch 22a latches an output value of the tri-state buffer 21a.

Figure 3:
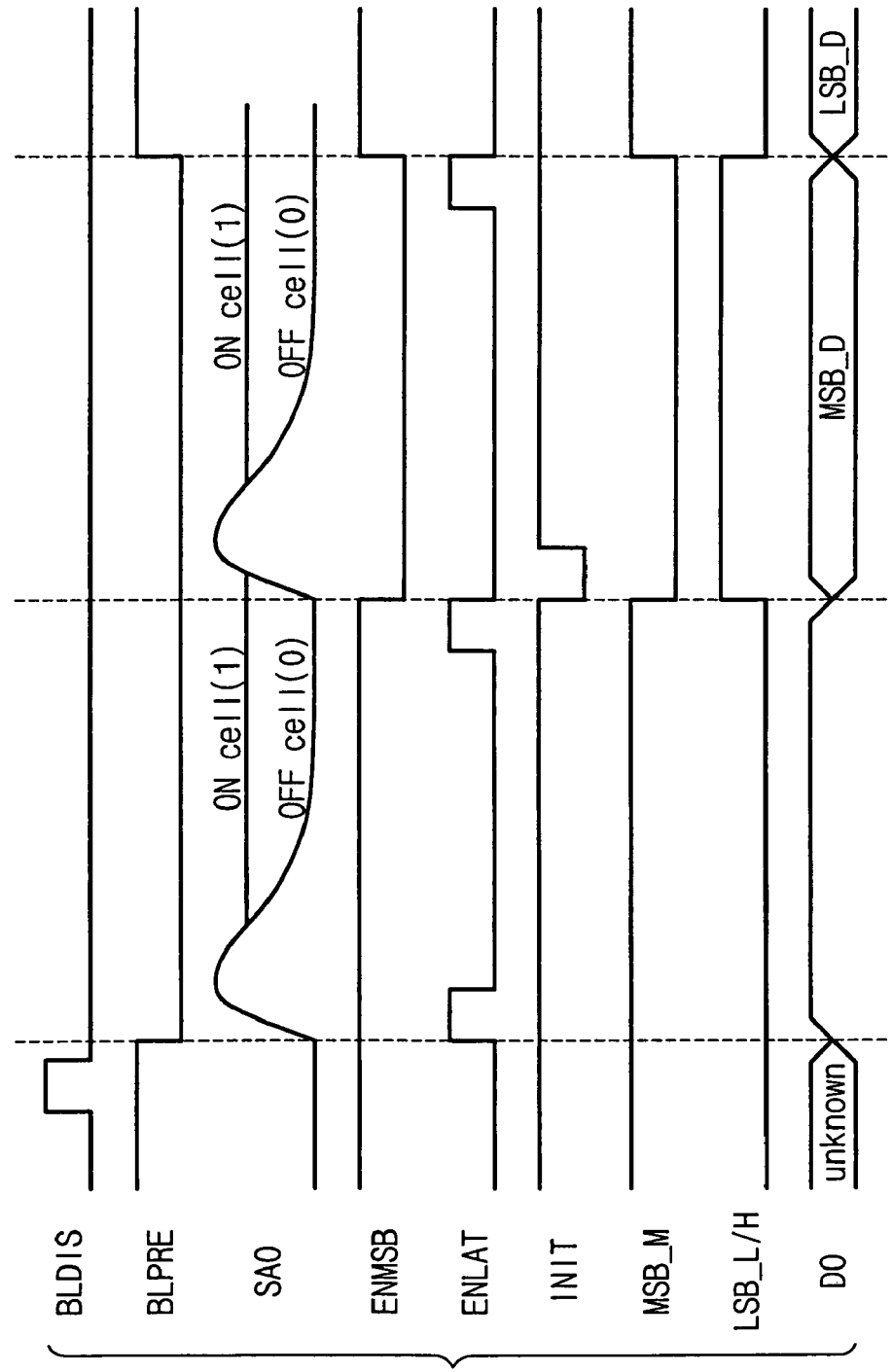
FIG. 3 is a waveform timing diagram illustrating the timing of control signals produced by a controller in FIG. 1.

FIG. 3 is a waveform timing diagram illustrating the timing of the control signals output by controller 50a. In particular, FIG. 3 shows the timing of the control signals during a read operation of memory cell 1a.

Referring to FIG. 3, bitline discharge signal BLDIS is activated to discharge the bitline connected to memory cell 1a. Then, bitline precharge signal BLPRE is deactivated to turn on the first and second PMOS transistors in precharge circuit 11a, thereby charging sensing node SA0 to a "high" level.

Selection signal MSB_M is activated to generate the reference current through NMOS transistors N12 and N15 in response to an activation of MSB enable signal ENMSB. As a result, the magnitude of the reference current is determined by reference voltage DG_M.

Sense amplifier 10a senses and amplifies a difference between the cell current and the reference current. When the cell current is greater than the reference current, the voltage level of sensing node SA0 increases. Otherwise, if the cell current is smaller than the reference current, the voltage level of sensing node SA0 decreases. Accordingly, the voltage level of sensing node SA0 is used to determine the logic state of MSB data MSB_D in memory cell 1a. Where MSB data MSB_D is a logical "1", the voltage level of sensing node SA0 either increases or it remains at a "high" level. Where MSB data MSB_D is a logical "0", the voltage level of sensing node decreases to a "low" level. The respective "high" and "low" voltage levels are labeled in FIG. 3 as "ON cell(1)" and "OFF cell(0)".

Next, latch enable signal ENLAT is activated to cause latch circuit 20a to latch the voltage level of sensing node SA0 and store it as MSB data bit MSB_D.

Next, initialization signal INIT is input to sensing node precharge circuit 13a to charge sensing node SA0 to the "high" level. Then, MSB enable signal ENMSB is deactivated and MSB data MSB_D is output by latch circuit 20a.

When MSB enable signal MSB_D is deactivated, selection circuit 30a generates selection signal LSB_L or selection signal LSB_H depending on the value of MSB data bit MSB_D. Where the value of MSB data bit MSB_D is logical "1", selection signal LSB_L is generated, and where MSB data bit MSB_D is logical "0", selection signal LSB_H is generated.

Where selection signal LSB_L is generated, the magnitude of the reference current is determined by reference voltage DG_L. Alternatively, where selection signal LSB_H is generated, the magnitude of the reference current is determined by reference voltage DG_H. Reference voltages DG_L and DG_H control the magnitude of the reference current so that sense amplifier 10a can determine the value of LSB data LSB_D stored in memory cell 1a.

To further illustrate the operation of sense amplifier 10a, a specific example will be presented where the value of MSB data MSB_D is logical "1" and the value of LSB data LSB_D is logical "0".

Under these conditions, a first reference current is generated to detect the value of MSB data MSB_D. Since MSB data MSB_D is logical "1", the reference current will be less than or equal to the cell current and therefore the voltage level of sensing node SA0 will remain "high", and latch circuit will store the "high" voltage level. Then, a second reference current will be generated to detect the value of LSB data LSB_D. Since the value of LSB data LSB_D is logical "0", the reference current will be greater than the cell current and therefore the voltage level of sensing node SA0 will drop to the "low" voltage level, and latch circuit 20a will store the "low" voltage level as LSB dta LSB_D.

Latch circuit 20a latches MSB data MSB_D and LSB data LSB_D and outputs the data through an output node D0.

Figure 4:
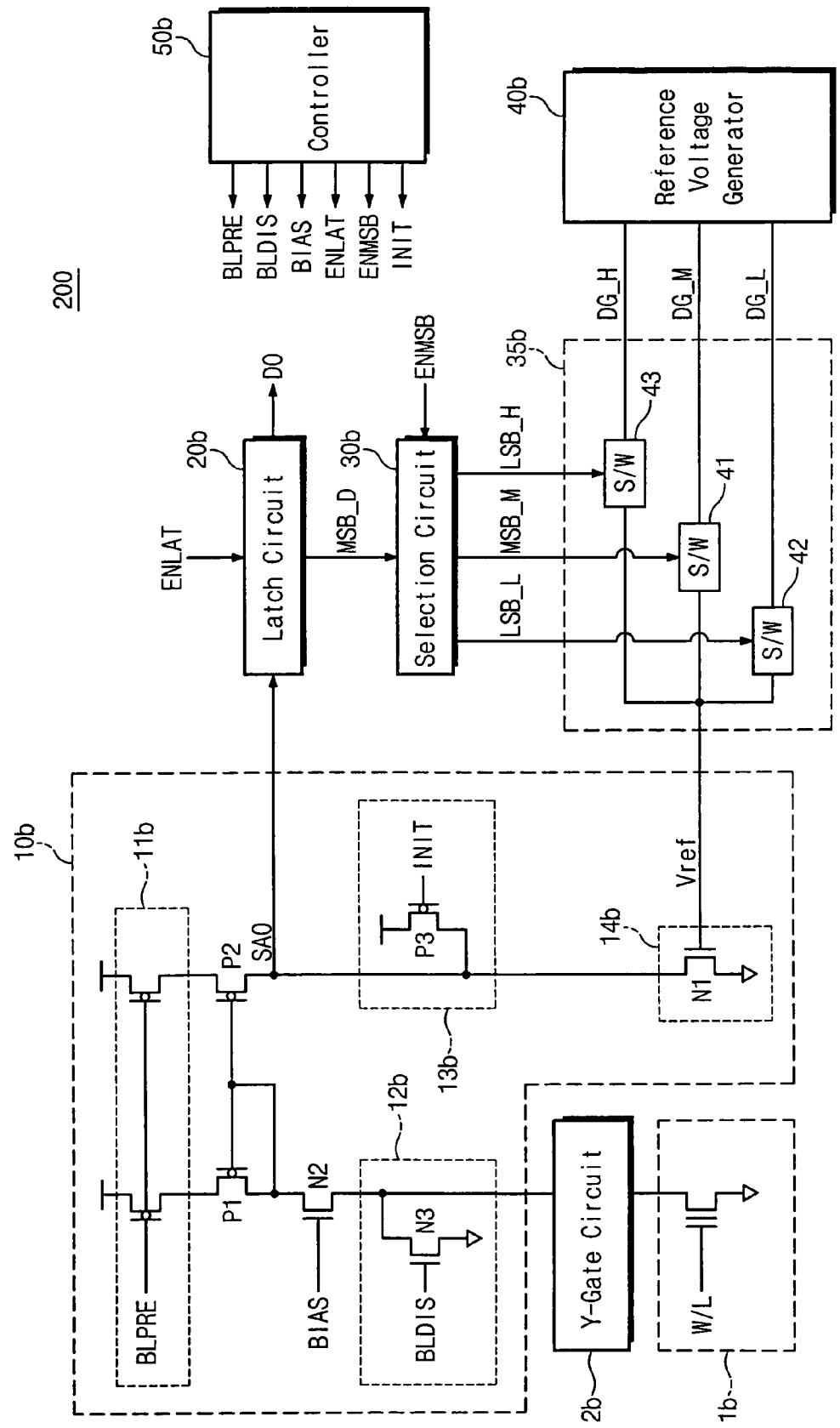
FIG. 4 is a block diagram of a NOR flash memory device according to another embodiment of the present invention.

FIG. 4 is a block diagram showing a NOR flash memory device according to another embodiment of the present invention. Referring to FIG. 4, a NOR flash memory device 200 comprises a memory cell 1b, a Y-gate circuit 2b, a sense amplifier 10b, a latch circuit 20b, a selection circuit 30b, a switch circuit 35b, a reference voltage generator 40b, and a controller 50b. Memory cell 1b, Y-gate circuit 2b, latch circuit 20b, selection circuit 30b, reference voltage generator 40b, and controller 50b are the same as respective elements 1a, 2a, 20a, 30a, 40a, and 50a described in FIGS. 1 through 3.

Sense amplifier 10b comprises a precharge circuit 11b, a bitline discharge circuit 12b, a sensing node precharge circuit 13b, and a reference current generating circuit 14b. Here, precharge circuit 11b, bitline discharge circuit 12b, and sensing node precharge circuit 13b are the same as respective elements 11a, 12b, and 13b described in relation to FIG. 1. Reference current generating circuit 14b generates a reference current in response to a reference voltage Vref. Reference current generating circuit 14b typically comprises a NMOS transistor N1.

Switch circuit 35b comprises first, second, and third switches 41, 42, and 43 controlled by selection signals MSB_M, LSB_L, and LSB_H, respectively. Switches 41, 42, and 43 typically comprise pass transistors, NMOS transistors, or PMOS transistors. Switch circuit 35b provides reference voltage Vref to reference current generating circuit 14b.

When first switch 41 is turned on, switch circuit 35b provides a first reference voltage DG_M to reference current generating circuit 14b. First reference voltage DG_M is used to generate the reference current when detecting the level of MSB data MSB_D stored in memory cell 1b. When either of second or third switches 42 and 43 is turned on, switch circuit 35b provides a second or third reference voltage DG_L or DG_H to reference current generating circuit 14b. Second and third voltages DG_L and DG_H are used to generate the reference current when detecting the value of LSB data LSB_D stored in memory cell 1b.

Since NOR flash memory device 200 receives different reference voltages on a single NMOS transistor, any deviation in the reference current based on transistor mismatches is eliminated.

As previously mentioned, a NOR flash memory device according to embodiments of the present invention uses a serial sensing technique to detect the logic state of a NOR flash memory cell. The serial sensing technique uses a single sense amplifier to avoid errors that commonly occur due to mismatched sense amplifiers in conventional multi-level cell devices.

The foregoing preferred embodiments are teaching examples. Those of ordinary skill in the art will understand that various changes in form and details may be made to the exemplary embodiments without departing from the scope of the present invention as defined by the following claims.

What is claimed:

1. A NOR flash memory device, comprising:
  a memory cell adapted to store two or more bits of data;
  a reference voltage generator adapted to generate a plurality of different reference voltages;
  a sense amplifier adapted to sequentially detect the values of the two or more bits of data according to a reference current whose magnitude is determined by the different reference voltages; and
  a selection circuit adapted to select which of the different reference voltages determine the magnitude of the reference current.

2. The NOR flash memory device of claim 1, wherein the sense amplifier comprises:

a reference current generating circuit connected to a sensing node and adapted to receive the different reference voltages from the reference voltage generator; and a reference current selection circuit connected between the reference current generating circuit and ground and adapted to receive a plurality of selection signals from the selection circuit;

wherein the reference current selection circuit is adapted to connect the sensing node to ground through different current paths corresponding to the different reference voltages in response to the plurality of selection signals; and wherein the magnitude of the reference current depends on which of the different current paths connects the sensing node to ground.

3. The NOR flash memory device of claim 2, wherein the reference current generating circuit comprises:

a plurality of N-type metal-oxide semiconductor (NMOS) transistors connected in parallel between the sensing node and ground and respectively controlled by the different reference voltages.

4. The NOR flash memory device of claim 3, wherein the reference current selection circuit comprises:

a plurality of switches connected in parallel between the NMOS transistors and ground and respectively controlled by the plurality of selection signals.

5. The NOR flash memory device of claim 4, wherein each of the switches comprises an NMOS transistor.

6. The NOR flash memory device of claim 1, wherein the sense amplifier comprises:

a reference current generating circuit adapted to determine the magnitude of the reference current according to the different reference voltages.

7. The NOR flash memory device of claim 6, wherein the reference current generating circuit is connected between a sensing node and ground.

8. The NOR flash memory device of claim 7, wherein the reference current generating circuit comprises:

a N-type metal-oxide semiconductor (NMOS) transistor connected between the sensing node and ground.

9. The NOR flash memory device of claim 1, further comprising:

a sensing node precharge circuit adapted to precharge a sensing node connected to the reference current generating circuit to a predetermined voltage level after the sense amplifier detects the value of a most significant bit in the two or more bits of data.

10. The NOR flash memory device of claim 9, wherein the predetermined voltage level is the level of a power supply voltage.

11. The NOR flash memory device of claim 9, wherein the sensing node precharge circuit comprises:

a metal-oxide semiconductor (MOS) transistor forming a current path between a power supply and the sensing node.

12. A NOR flash memory device, comprising:

a memory cell adapted to store two or more bits of data;

a reference voltage generator adapted to generate a plurality of different reference voltages;

a sense amplifier adapted to sequentially detect the values of the two or more bits of data according to a reference current whose magnitude is determined by the different reference voltages;

a latch circuit adapted to store the values detected by the sense amplifier; and a selection circuit adapted to select which of the different reference voltages determine the magnitude of the reference current.

13. The NOR flash memory device of claim 12 wherein the sense amplifier comprises:

a reference current generating circuit connected to a sensing node and adapted to receive the different reference voltages from the reference voltage generator;

a reference current selection circuit connected between the reference current generating circuit and ground and adapted to receive a plurality of selection signals from the selection circuit; and a sensing node precharge circuit adapted to precharge a sensing node connected to the reference current generating circuit to a predetermined voltage level after the sense amplifier detects the value of a most significant bit in the two or more bits of data;

wherein the reference current selection circuit is adapted to connect the sensing node to ground through different current paths corresponding to the different reference voltages in response to the plurality of selection signals; and wherein the magnitude of the reference current depends on which of the different current paths connects the sensing node to ground.

14. The NOR flash memory device of claim 13, wherein the reference current selection circuit comprises:

a plurality of N-type metal-oxide semiconductor (NMOS) transistors connected in parallel between the sensing node and ground, and adapted to form different current paths between the sensing node and the ground in response to the different reference voltages.

15. The NOR flash memory device of claim 14, wherein the reference current selection circuit comprises:

a plurality of switches connected in parallel between the NMOS transistors and ground, and controlled by the plurality of selection signals.

16. The NOR flash memory device of claim 13, wherein the sensing node precharge circuit comprises:

a metal-oxide semiconductor (MOS) transistor connected between a power supply and the sensing node.

17. The NOR flash memory device of claim 12, wherein the latch circuit comprises:

a tri-state buffer adapted to receive the values of the bits of data detected by the sense amplifier;

a data latch adapted to store an output value produced by the tri-state buffer; and a data line connecting the tri-state buffer and the latch;

wherein the tri-state buffer discharges the data line before receiving each value of the bits of data detected by the sense amplifier.

18. A NOR flash memory device comprising:

a memory cell adapted to store two or more bits of data;

a reference voltage generator adapted to generate a plurality of different reference voltages;

a sense amplifier adapted to sequentially detect the values of the two or more bits of data according to a reference current whose magnitude is determined by the different reference voltages;

a latch circuit adapted to store the values detected by the sense amplifier; and a selection circuit adapted to select which of the different reference voltages determine the magnitude of the reference current; and a switch circuit adapted to provide one of the different reference voltages to the sense amplifier in response to a plurality of selection signals generated by the selection circuit.

19. The NOR flash memory device of claim 18 wherein the sense amplifier comprises:
   a reference voltage generating circuit connected between a sensing node and ground, and adapted to generate the reference current according to a level of the reference voltage provided to the sense amplifier; and
   a sensing node precharge circuit connected to the sensing node and adapted to precharge the sensing node to a predetermined voltage level after the value of a most significant bit data is detected by the sense amplifier.

20. The NOR flash memory device of claim 19, wherein the reference current generating circuit comprises:
   a N-type metal-oxide semiconductor (NMOS) transistor connected between the sensing node and ground.

21. The NOR flash memory device of claim 19, wherein the sensing node precharge circuit comprises a metal-oxide semiconductor (MOS) transistor connected between a power supply and the sensing node.

22. The NOR flash memory device of claim 18, wherein the latch circuit comprises:
   a tri-state buffer adapted to receive the value of the bits of data detected by the sense amplifier;
   a data latch adapted to store an output value produced by the tri-state buffer; and
   a data line connecting the tri-state buffer and the latch;
   wherein the tri-state buffer discharges the data line before receiving the value of the bits of data detected by the sense amplifier.

23. A method of sequentially detecting the values of two or more bits of data stored in a memory cell of a NOR flash memory device, the method comprising:
   detecting the value of a most significant bit of data stored in the memory cell according to a voltage level apparent at a sensing node;
   upon detecting the value of the most significant bit, precharging the sensing node to a predetermined voltage level; and,
   sensing the value of a least significant bit stored in the memory cell according to the value of the most significant bit;
   wherein the value of the most significant bit is detected in response to a most significant bit enable signal ENMSB.

24. The method set of claim 23, wherein the predetermined voltage level is a power supply voltage.

25. The method of claim 23, wherein the NOR flash memory device comprises:
   a memory cell adapted to store two or more bits of data;
   a reference voltage generator adapted to generate a plurality of different reference voltages;
   a sense amplifier adapted to sequentially detect the values of the two or more bits of data according to a reference current whose magnitude is determined by the different reference voltages; and
   a selection circuit adapted to select which of the different reference voltages determine the magnitude of the reference current.

26. The method of claim 23, wherein the sense amplifier comprises:
   a reference current generating circuit connected to a sensing node and adapted to receive the different reference voltages from the reference voltage generator; and
   a reference current selection circuit connected between the reference current generating circuit and ground and adapted to receive a plurality of selection signals from the selection circuit;
   wherein the reference current selection circuit is adapted to connect the sensing node to ground through different current paths corresponding to the different reference voltages in response to the plurality of selection signals; and
   wherein the magnitude of the reference current depends on which of the different current paths connects the sensing node to ground.

27. A flash memory device, comprising:
   a memory cell adapted to store two or more bits of data;
   a reference voltage generator adapted to generate a plurality of different reference voltages;
   a sense amplifier adapted to sequentially detect the values of the two or more bits of data according to a reference current whose magnitude is determined by the different reference voltages; and
   a selection circuit adapted to select which of the different reference voltages determine the magnitude of the reference current.

28. The flash memory device of claim 27, wherein the sense amplifier comprises:
   a reference current generating circuit connected to a sensing node and adapted to receive the different reference voltages from the reference voltage generator; and
   a reference current selection circuit connected between the reference current generating circuit and ground and adapted to receive a plurality of selection signals from the selection circuit;
   wherein the reference current selection circuit is adapted to connect the sensing node to ground through different current paths corresponding to the different reference voltages in response to the plurality of selection signals; and
   wherein the magnitude of the reference current depends on which of the different current paths connects the sensing node to ground.

29. The flash memory device of claim 28, wherein the reference current generating circuit comprises:
   a plurality of N-type metal-oxide semiconductor (NMOS) transistors connected in parallel between the sensing node and ground and respectively controlled by the different reference voltages.

30. The flash memory device of claim 29, wherein the reference current selection circuit comprises:
   a plurality of switches connected in parallel between the NMOS transistors and ground and respectively controlled by the plurality of selection signals.

31. The flash memory device of claim 27, wherein the sense amplifier comprises:
   a reference current generating circuit adapted to determine the magnitude of the reference current according to the different reference voltages.

32. The flash memory device of claim 31, wherein the reference current generating circuit is connected between a sensing node and ground.

33. The flash memory device of claim 32, wherein the reference current generating circuit comprises:
   a N-type metal-oxide semiconductor (NMOS) transistor connected between the sensing node and ground.

34. The flash memory device of claim 27, further comprising:

a sensing node precharge circuit adapted to precharge a sensing node connected to the reference current generating circuit to a predetermined voltage level after the sense amplifier detects the value of a most significant bit in the two or more bits of data.

35. The flash memory device of claim 34, wherein the predetermined voltage level is the level of a power supply voltage.

36. The flash memory device of claim 34, wherein the sensing node precharge circuit comprises:

a metal-oxide semiconductor (MOS) transistor forming a current path between a power supply and the sensing node.

37. The flash memory device of claim 30, wherein each of the switches comprises an NMOS transistor.

38. A NOR flash memory device, comprising:

a memory cell adapted to store two or more bits of data;

a sense amplifier adapted to sequentially detect the values of the two or more bits of data according to a reference circuit; and a sensing node precharge circuit adapted to precharge a sensing node to a predetermined voltage level after the sense amplifier detects one bit among the two or more bits of data.

* * * * *